US008633694B2

(12) United States Patent
Takai

(10) Patent No.: US 8,633,694 B2
(45) Date of Patent: Jan. 21, 2014

(54) MAGNETIC RESONANCE IMAGING APPARATUS

(75) Inventor: Hiroshi Takai, Nasushiobara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 505 days.

(21) Appl. No.: 12/910,102

(22) Filed: Oct. 22, 2010

(65) Prior Publication Data

US 2011/0098552 A1 Apr. 28, 2011

(30) Foreign Application Priority Data

Oct. 23, 2009 (JP) ................. 2009-244148

(51) Int. Cl.
*G01V 3/00* (2006.01)
(52) U.S. Cl.
USPC .......................................... 324/309; 382/128
(58) Field of Classification Search
USPC ................ 324/309, 307, 306; 382/128
See application file for complete search history.

(56) References Cited

U.S. PATENT DOCUMENTS

| 4,833,407 | A | * | 5/1989 | Holland et al. | 324/309 |
| 5,459,401 | A | * | 10/1995 | Kiefer | 324/309 |
| 5,742,163 | A | * | 4/1998 | Liu et al. | 324/309 |
| 6,242,916 | B1 | * | 6/2001 | King | 324/309 |
| 8,320,646 | B2 | * | 11/2012 | Hu et al. | 382/128 |

OTHER PUBLICATIONS

McGibney, G. et al., "Quantitative Evaluation of Several Partial Fourier Reconstruction Algorithms Used in MRI", Magnetic Resonance in Medicine, vol. 30, (1993), pp. 51-59.
Haacke, E.M. et al., "A Fast, Iterative, Partial-Fourier Technique Capable of Local Phase Recovery", Journal of Magnetic Resonance, vol. 92, (1991), pp. 126-145.

* cited by examiner

*Primary Examiner* — Louis Arana
(74) *Attorney, Agent, or Firm* — Nixon & Vanderhye PC

(57) ABSTRACT

According to one embodiment, a magnetic resonance imaging apparatus includes; a data collection unit which collects magnetic resonance data from a patient by a half Fourier method using a plurality of coils; an unfolding unit which performs an unfolding process on a plurality of items of folded image data obtained from the plurality of coils to generate unfolded image data by using sensitivity data of the plurality of coils; and a data processing unit which repeatedly performs a data filling process and a phase correction process to improve accuracy of data in an unsampled region to generate image data for display, the data filling process filling the unsampled region in k-space with k-space data obtained by Fourier-transforming the unfolded image data and the unsampled region being a region for which the data have not been collected.

6 Claims, 8 Drawing Sheets

MAGNETIC RESONANCE IMAGING APPARATUS

CROSS-REFERENCE TO RELATED APPLICATIONS

This application is based upon and claims the benefit of priority from Japanese Patent Application No. 2009-244148 filed on Oct. 23, 2009, the entire contents of which are incorporated herein by reference.

FIELD

Embodiments described herein relate generally to a Magnetic Resonance Imaging apparatus.

BACKGROUND

Magnetic resonance imaging is an imaging method which magnetically excites nuclear spins of a patient placed in a static magnetic field with an RF signal at the Larmor frequency to reconstruct an image using a magnetic resonance signal resulting from the excitation.

An HFI (Half Fourier Imaging) method is known in the field of magnetic resonance imaging. The HFI method, which uses complex symmetry of data in k-space, fills those regions of the k-space in which data has not been collected with data based on collected k-space data and thereby constructs an image.

Also, in the field of magnetic resonance imaging, PI (parallel imaging) is known as a high-speed imaging technique which uses differences in the sensitivity distributions for RF magnetic fields of multiple coil elements. PI is an imaging method which receives echo data using the multiple coil elements, makes a phase-encoding step size larger than normal, and thereby reduces the number of phase-encoding lines needed for image reconstruction. Consequently, the use of PI makes it possible to reduce imaging time greatly. Specifically, it is only necessary to collect data of approximately half a specified number of phase-encoding lines. Thus, the imaging time is cut almost in half.

When echo data is collected during parallel imaging, folded intermediate image data is generated for each channel corresponding to each coil element. Then, an unfolding process is applied to multiple items of intermediate image data corresponding in number to the number of channels to remove folding, and consequently a single set of unfolded final image data is generated. RF magnetic field (B1) sensitivity distribution data of each coil element is used in the unfolding process.

Conventionally, parallel imaging which uses multiple coil elements employs half Fourier imaging.

FIG. 1 is a flowchart showing conventional data processing procedures in which PI and HFI are used in conjunction.

As shown in Step S1 in FIG. 1, an HFI process is performed to fill in data not collected in the k-space based on k-space data collected by PI on a channel-by-channel basis. Consequently, folded intermediate image data is generated for each channel.

The HFI process is performed as follows.

First, as shown by expression (1-1) and expression (1-2), a filtering process fh using a Homodyne filter and filtering process fl using a low-pass filter are performed on k-space data K(i) collected by coil elements i (i=1, 2, 3, ..., Nch), and k-space data Kh(i) filtered through the Homodyne filter and k-space data Kl(i) filtered through the low-pass filter are generated.

$$K(i)*fh \rightarrow Kh(i) \quad (1\text{-}1) \text{ (Step S11)}$$

$$K(i)*fl \rightarrow Kl(i) \quad (1\text{-}2) \text{ (Step S11)}$$

Next, as shown by expression (2-1) and expression (2-2), inverse fast Fourier transforms (IFFTs) are performed on the k-space data Kh(i) filtered through the Homodyne filter and k-space data Kl(i) filtered through the low-pass filter, and consequently folded intermediate image data Vh(i) and Vl(i) are generated as real space (R-space) data.

$$IFFT(Kh(i)) \rightarrow Vh(i) \quad (2\text{-}1) \text{ (Step S12)}$$

$$IFFT(Kl(i)) \rightarrow Vl(i) \quad (2\text{-}2) \text{ (Step S12)}$$

In Step S13, the number of iterations of the HFI process is checked, and if the number of iterations is less than a predetermined number M, the flow goes to Step S14.

In Step S14, a phase correction process is performed using expression (3), and consequently intermediate image data V(i) is generated for each coil element i.

$$V(i)=2 \cdot \text{Real part}\{Vh(i)*Vl(i)/|Vl(i)|\} \quad (3) \text{ (Step S14)}$$

In Step S15, fast Fourier transforms (FFTs) are performed on the intermediate image data V(i) subjected to the phase correction process, and consequently the real space data is reconverted into k-space data FFT(V(i)). The resulting k-space data FFT(V(i)) is full k-space data, meaning that those regions of the k-space from which data was not collected have been filled with data. This is due to the filtering process (Step S11) and inverse Fourier transform process (Step S12), through which a data filling process is performed indirectly. However, at this stage, accuracy of the data in the filled regions is not necessarily high. Next, the k-space data FFT(V(i)) and collected k-space data K(i) undergo weighted addition using a weighting coefficient α.

$$K(i)=\alpha*FFT(V(i))+(1-\alpha)*K(i) \quad (4) \text{ (Step S16)}$$

Results of the weighted addition is used as k-space data K(i) to calculate intermediate image data V(i) again and the HFI process represented by expressions (1-1), (1-2), (2-1), (2-2), (3), and (4) is repeated a predetermined number M of iterations (e.g., 2 to 4 times) to improve accuracy of the filling process in the k-space. That is, the processes from Step S11 to Step S16 including the phase correction process and data filling process—i.e., the HFI process according to the present embodiment—are repeated the predetermined number of times.

Next, in Step S2, an unfolding process is performed on the channel-by-channel intermediate image data Vh(i) and Vl(i) obtained using expressions (2-1) and (2-2). That is, as shown by expressions (5-1) and expression (5-2), unfolded MR pixel values xh and xl at position Npt are found as respective vectors from imaging signal strengths yh and yl given by respective vectors whose components are Nch items of intermediate image data Vh(i) and Vl(i), respectively, as well as from an Nch×Npt sensitivity matrix S which represents sensitivity at the position Npt of each coil element i.

$$xh=(S_H S)^{-1} S_H yh \quad (5\text{-}1)$$

$$xl=(S_H S)^{-1} S_H yl \quad (5\text{-}2)$$

where
yh={Vh(1), Vh(2), ..., Vh(Nch)}
yl={Vl(1), Vl(2), ..., Vl(Nch)}
xh={Vh_unfold(1), Vh_unfold(2), ..., Vh_unfold(Npt)}
xl={Vl_unfold(1), Vl_unfold(2), ..., Vl_unfold(Npt)}
$S_H$ is a transposed complex conjugate matrix of the matrix S.

When components of the MR pixel value vectors xh and xl are positioned, unfolded image data Vh_unfold and Vl_unfold without folding are generated, respectively.

Next, in Step S3, the image data Vh_unfold and Vl_unfold are subjected to the phase correction process given by expression (6) to generate final image data Vfinal.

$$V\text{final} = 2 \cdot \text{Real part}\{Vh\_unfold * Vl\_unfold / |Vl\_unfold|\} \quad (6)$$

Subsequently, image processing such as distortion correction is applied as required (Step S4). However, when PI and HFI are used in conjunction, conventional processing methods need to perform the HFI process repeatedly on a channel-by-channel basis to improve the accuracy of the filling process in the k-space. Consequently, the number of times the HFI process is repeated equals the number of channels×the number of iterations, resulting in increased amounts of data processing and data processing time. Therefore, there is demand to reduce the amounts of data processing and data processing time.

DETAILED DESCRIPTION

Embodiments of a magnetic resonance imaging apparatus will be described with reference to the accompanying drawings.

In general, according to one embodiment, a magnetic resonance imaging apparatus includes; a data collection unit which collects magnetic resonance data from a patient by a half Fourier method using a plurality of coils; an unfolding unit which performs an unfolding process on a plurality of items of folded image data obtained from the plurality of coils to generate unfolded image data by using sensitivity data of the plurality of coils; and a data processing unit which repeatedly performs a data filling process and a phase correction process to improve accuracy of data in an unsampled region to generate image data for display, the data filling process filling the unsampled region in k-space with k-space data obtained by Fourier-transforming the unfolded image data and the unsampled region being a region for which the data have not been collected.

(Configuration and Functionality)

Figure 2:
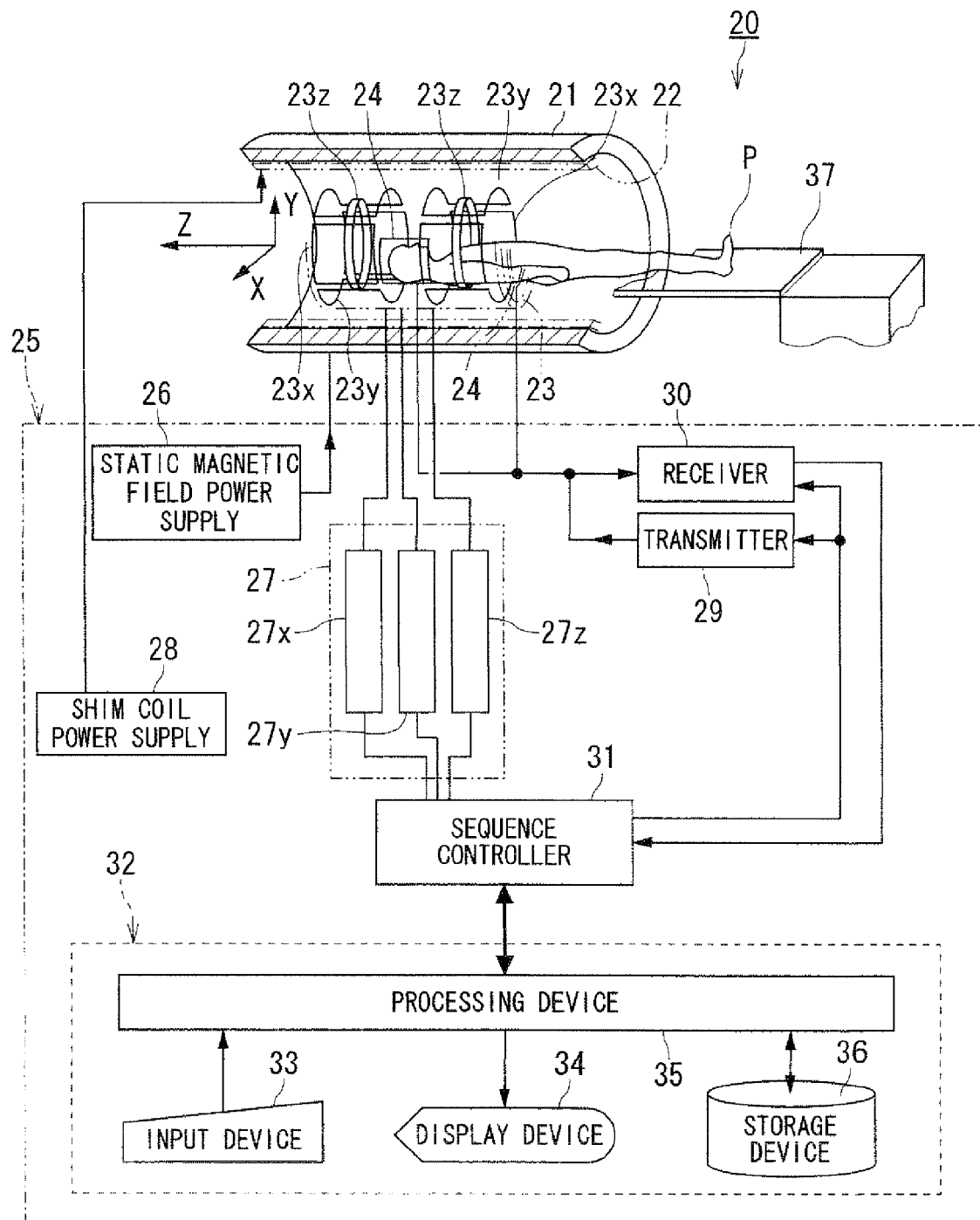
FIG. 2 is a block diagram showing a magnetic resonance imaging apparatus.

FIG. 2 is a block diagram showing a configuration example of a magnetic resonance imaging apparatus 20 according to an embodiment.

The magnetic resonance imaging apparatus 20 includes a static magnetic field magnet 21 which is cylindrical in shape and configured to generate a static magnetic field, a shim coil 22 installed in the static magnetic field magnet 21, a gradient coil 23, and RF coils 24.

Also, the magnetic resonance imaging apparatus 20 includes a control system 25. The control system 25 has a static magnetic field power supply 26, a gradient power supply 27, a shim coil power supply 28, a transmitter 29, a receiver 30, a sequence controller 31, and a computer 32. The gradient power supply 27 of the control system 25 includes an X-axis gradient power supply 27x, Y-axis gradient power supply 27y, and Z-axis gradient power supply 27z. Also, the computer 32 is equipped with an input device 33, a display device 34, a processing device 35, and a storage device 36.

The static magnetic field magnet 21 is connected with the static magnetic field power supply 26 and forms a static magnetic field in an imaging area using an electric current supplied from the static magnetic field power supply 26. The static magnetic field magnet 21 is often made of a superconducting coil and is connected with the static magnetic field power supply 26 during excitation to draw electric current, but generally becomes disconnected once excited. On the other hand, there are cases in which the static magnetic field magnet 21 is made of a permanent magnet without installation of the static magnetic field power supply 26.

The shim coil 22 which is cylindrical in shape is installed concentrically inside the static magnetic field magnet 21. The shim coil 22 is connected with the shim coil power supply 28, supplied with electric current from the shim coil power supply 28, and configured to make the static magnetic field uniform.

The gradient coil 23 is made up of an X-axis gradient coil 23x, Y-axis gradient coil 23y, and Z-axis gradient coil 23z and formed into a cylindrical shape inside the static magnetic field magnet 21. A bed 37 is installed in the gradient coil 23 and used as an imaging area with a patient P placed thereon. The RF coils 24 include a whole body coil (WBC) incorporated in a gantry and used to transmit and receive RF signals, and a local coil installed near the bed 37 or patient P and used to receive RF signals.

The gradient coil 23 is connected with the gradient power supply 27. The X-axis gradient coil 23x, Y-axis gradient coil 23y, and Z-axis gradient coil 23z of the gradient coil 23 are connected, respectively, with the X-axis gradient power supply 27x, Y-axis gradient power supply 27y, and Z-axis gradient power supply 27z of the gradient power supply 27.

A gradient magnetic field Gx in an X-axis direction, gradient magnetic field Gy in a Y-axis direction, and gradient magnetic field Gz in a Z-axis direction are designed to be formed, respectively, in the imaging area by electric currents supplied to the X-axis gradient coil 23x, Y-axis gradient coil 23y, and Z-axis gradient coil 23z, respectively, from the X-axis gradient power supply 27x, Y-axis gradient power supply 27y, and Z-axis gradient power supply 27z.

The RF coils 24 are connected to the transmitter 29 and/or receiver 30. Transmitting RF coils 24 receive an RE signal from the transmitter 29 and transmit the RF signal to the patient P. Receiving RF coils 24 receive an NMR signal generated when nuclear spins in the patient P is excited by the RE signal and supply the NMR signal to the receiver 30.

Figure 3:
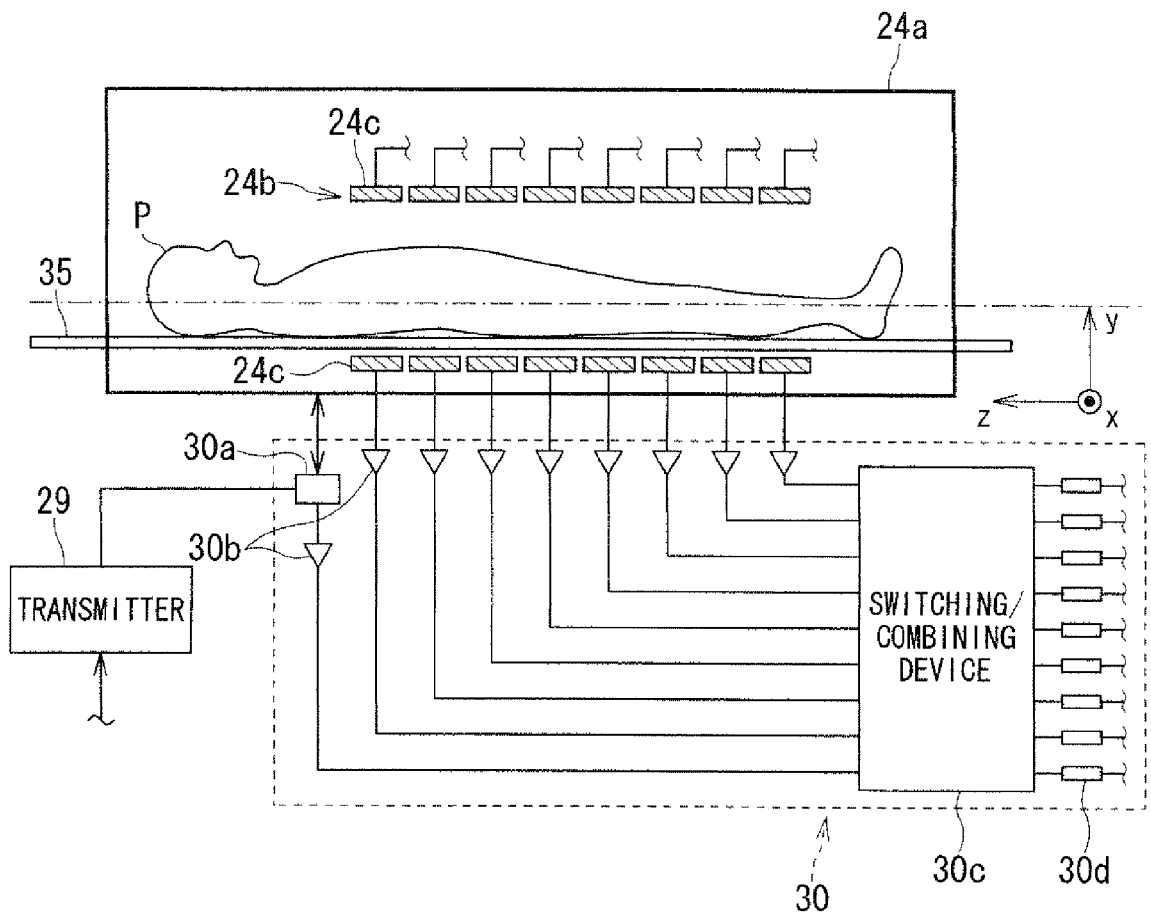
FIG. 3 is a diagram showing an example of detailed configuration of an RF coil.
Figure 4:
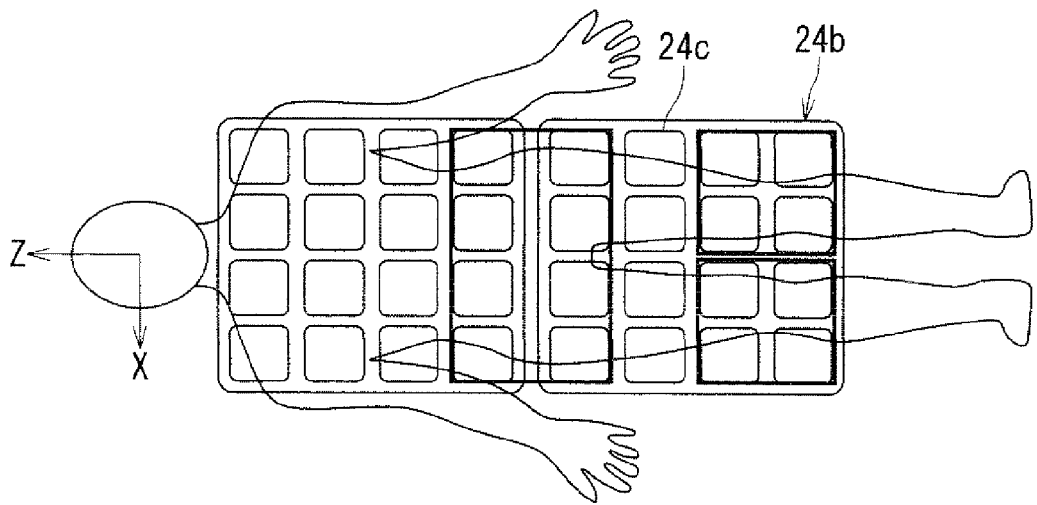
FIG. 4 is a diagram showing an exemplary arrangement of coil elements installed on the front side of a patient.
Figure 5:
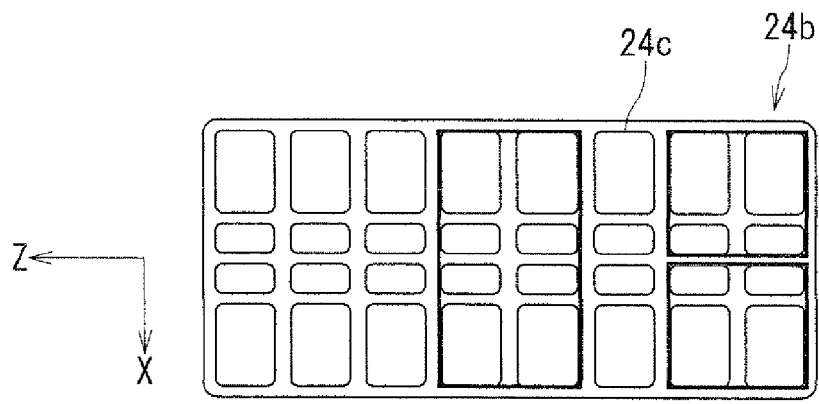
FIG. 5 is a diagram showing an exemplary arrangement of coil elements installed on the back side of the patient.

FIG. 3 is a diagram showing an example of detailed configuration of the RE coil 24 shown in FIG. 2. FIG. 4 is a diagram showing an exemplary arrangement of coil elements 24c installed on the front side of the patient P shown in FIG. 3. FIG. 5 is a diagram showing an exemplary arrangement of coil elements 24c installed on the back side of the patient P shown in FIG. 3.

As shown in FIG. 3, the RF coil 24 includes WB (whole-body) coils 24a cylindrical in shape and a phased array coil 24b. The phased array coil 24b includes multiple coil elements 24c, part of which is placed on the front side and the other part of which is placed on the back side of the patient P.

For example, as shown in FIG. 4, four rows of coil elements 24c are placed in an x direction and eight columns of coil elements 24c are placed in a z direction for a total of 32 coil elements 24c on the front side of the patient to cover a wide MRI region. Similarly, as shown in FIG. 5, four rows of coil elements 24c are placed in the x direction and eight columns of coil elements 24c are placed in the z direction for a total of 32 coil elements 24c on the back side of the patient to cover a wide MRI region. On the back side, coil elements 24c smaller than the other coil elements 24c are placed near the body axis to improve sensitivity by taking into consideration the existence of the spine of the patient P.

On the other hand, the receiver 30 includes a duplexer 30a, amplifiers 30b, one or more switching/combining devices 30c, and receiving-side circuits 30d. The duplexer 30a is connected with the transmitter 29 and WB coils 24a as well as with the amplifiers 30b for the WB coils 24a. There are as many amplifiers 30b as there are coil elements 24c and WB coils 24a, with which the amplifiers 30b are connected individually. There are one or more switching/combining devices 30c. On an input side, the switching/combining devices 30c are connected with the multiple coil elements 24c or WB coils 24a via the multiple amplifiers 30b. A desired number of receiving-side circuits 30d are installed on an output side of the switching/combining devices 30c without exceeding the number of coil elements 24c and the number of WB coils 24a.

The WB coils 24a can be used for transmission of RF signals. On the other hand, the coil elements 24c can be used for receiving the NMR signals. Besides, the WB coils 24a may be used for reception.

The duplexer 30a is configured to supply the WB coils 24a with transmit RF signals outputted from the transmitter 29 and supply the NMR signals received by the WB coils 24a to the switching synthesizer 30c via amplifiers 30b in the receiver 30. Also, the NMR signals received by the coil elements 24c are designed to be outputted to the switching synthesizer 30c via the respective amplifiers 30b.

The switching synthesizer 30c is configured to combine and switch the NMR signals received by the coil elements 24c and WB coils 24a and output the resulting signal to an appropriate receiving-side circuit 30d. In other words, the NMR signals received by the coil elements 24c and WB coils 24a are combined and switched by the switching synthesizer 30c according to the number of receiving-side circuits 30d and a sensitivity distribution is created according to an MRI region using desired number of coil elements 24c so that NMR signals can be received from various MRI regions.

However, the NMR signals may be received by the WB coils 24a alone without installing the coil elements 24c. Also, the NMR signals received by the coil elements 24c or WB coils 24a may be outputted directly to the receiving-side circuits 30d without installing the switching/combining devices 30c. Furthermore, a larger number of coil elements 24c may be placed in a wide range.

Figure 6:
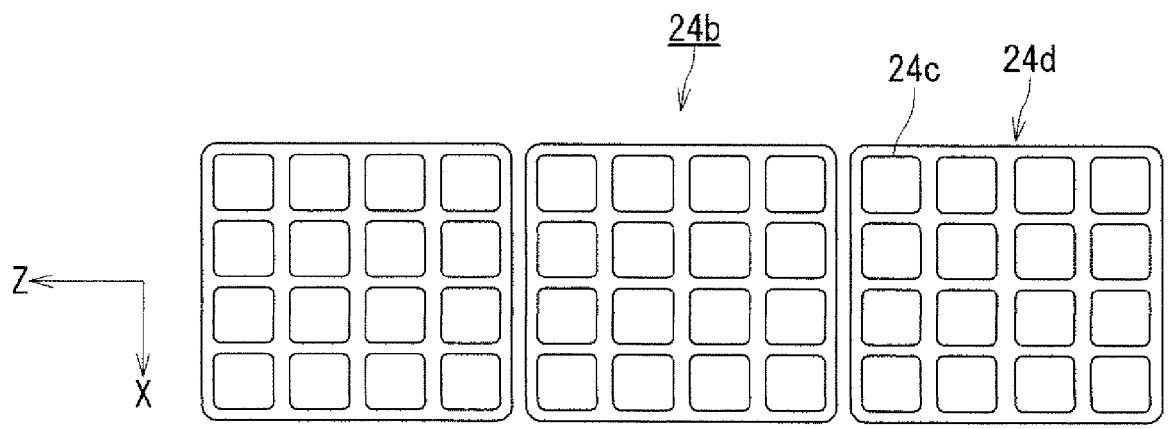
FIG. 6 is a diagram showing another exemplary arrangement of coil elements installed on the front side of the patient.
Figure 7:
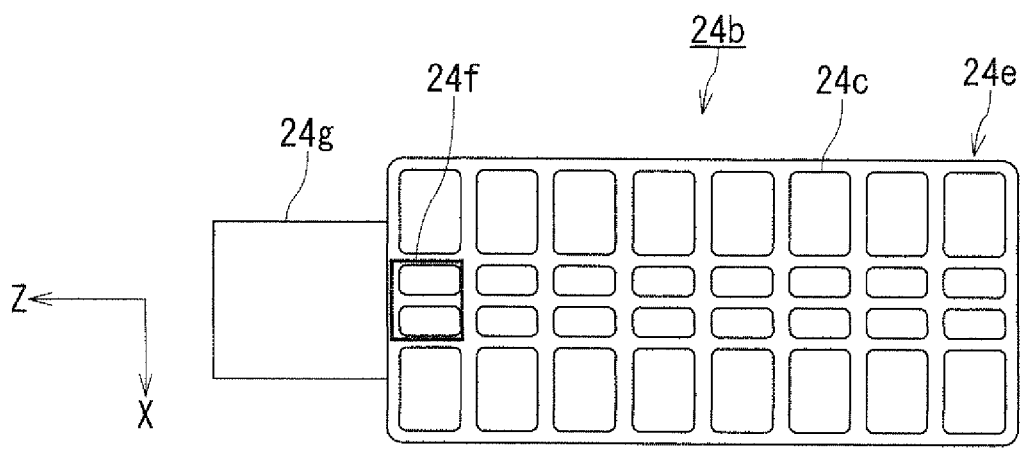
FIG. 7 is a diagram showing another exemplary arrangement of coil elements installed on the back side of the patient.

FIG. 6 is a diagram showing another exemplary arrangement of coil elements 24c installed on the front side of the patient P shown in FIG. 3. FIG. 7 is a diagram showing another exemplary arrangement of coil elements 24c installed on the back side of the patient P shown in FIG. 3.

As shown in FIGS. 6 and 7, a still larger number of coil elements 24c can be arranged around the patient P. In the example of FIG. 6, three coil units 24d are placed in the z direction for a total of 48 coil elements 24c, each coil unit 24d being made up of four rows of coil elements 24c placed in the x direction and four columns of coil elements 24c placed in the z direction for a total of 16 coil elements 24c. Also, in the example of FIG. 7, a total of 46 coil elements 24c are installed on the back side of the patient P. Specifically, a coil unit 24e is placed on the side of the spine, including four columns of coil elements 24c placed in the x direction and eight rows of coil elements 24c placed in the z direction for a total of 32 coil elements 24c, a coil unit 24f made up of two coil elements 24c (not shown) are placed near the jaws, and a coil unit 24g made up of 12 coil elements 24c (not shown) are placed under the head. When surface coils are placed on the front side and back side of the patient P as shown in FIGS. 6 and 7, a total of 94 coil elements 24c are placed around the patient. The coil elements 24c are connected to respective dedicated amplifiers 30b via a coil port (not shown).

By placing a large number of coil elements 24c around the patient P, it is possible to set up a whole-body phased array coil 24b which can receive data from multiple MRI regions without shifting locations of the coils and patient P. The WB coils 24a can also receive data from multiple MRI regions without shifting locations of the coils and patient P, but the use of the whole-body phased array coil 24b for reception makes it possible to receive data with a sensitivity and SNR (signal to noise ratio) more suitable for the MRI regions.

The sequence controller 31 of the control system 25 is connected with the gradient power supply 27, transmitter 29, and receiver 30. The sequence controller 31 has a capability to store control information such as sequence information needed to drive the gradient power supply 27, transmitter 29, and receiver 30, where the sequence information describes operational control information such as intensity, application duration, and application timing of a pulsed current to be applied to the gradient power supply 27. The sequence controller 31 also has a capability to drive the gradient power supply 27, transmitter 29, and receiver 30 according to a stored predetermined sequence and thereby generate an X-axis gradient magnetic field Gx, Y-axis gradient magnetic field Gy, Z-axis gradient magnetic field Gz, and RF signal.

The sequence controller 31 is configured to receive raw data and supply the raw data to the computer 32, where the raw data is complex data produced by the receiver 30 through detection and A/D (analog to digital) conversion of NMR signals.

The transmitter 29 supplies an RF signal to the RF coil 24 based on the control information received from the sequence controller 31. On the other hand, the receiver 30 detects the NMR signal received from the RF coil 24, performs required signal processing and A/D conversion, thereby generates raw data which is digitized complex data, and supplies the generated raw data to the sequence controller 31.

The computer 32 achieves various functions by causing the processing device 35 to execute programs stored in the storage device 36. However, specific circuits with various functions may be installed in the magnetic resonance imaging apparatus 20 without depending on programs.

Figure 8:
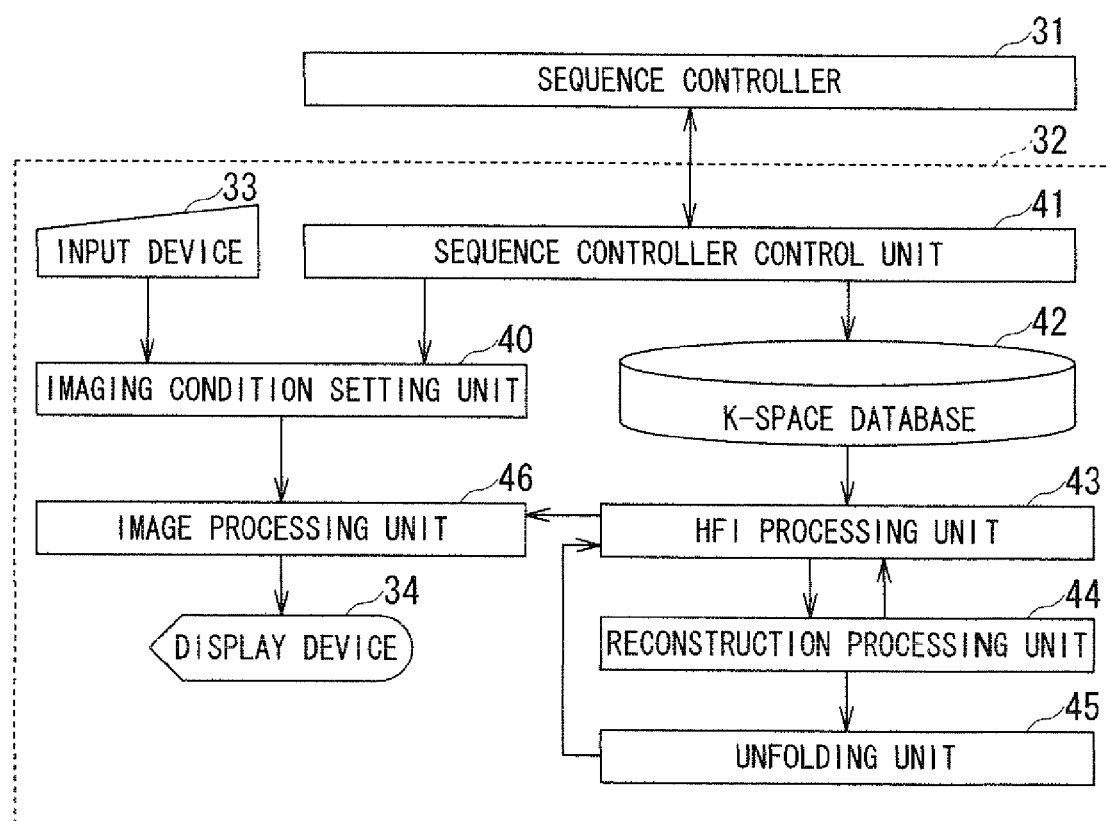
FIG. 8 is a functional block diagram of a computer.

FIG. 8 is a functional block diagram of the computer 32 shown in FIG. 2.

The computer 32 functions as an imaging condition setting unit 40, sequence controller control unit 41, k-space database 42, HFI processing unit 43, reconstruction processing unit 44, unfolding unit 45, and image processing unit 46 based on programs.

The imaging condition setting unit 40 sets PI and HFI imaging conditions based on command information from the input device 33, and supplies the set imaging conditions to the sequence controller control unit 41. The PI imaging conditions include the number of coil elements 24c used for data collection as well as information associating each coil element 24c with an imaging region. An HFI pulse sequence can be an FASE (fast asymmetric spin echo or fast advanced spin echo) sequence and the like.

Based on scan start command information from the input device 33, the sequence controller control unit 41 supplies imaging conditions including a pulse sequence to the sequence controller 31 and thereby drives and controls the sequence controller 31. Also, the sequence controller control unit 41 receives raw data from the sequence controller 31 and places the raw data as k-space data in the k-space formed in the k-space database 42.

The HFI processing unit 43 performs a process (HFI process) needed to generate final image data by HFI using the k-space data acquired from the k-space database 42 and the image data acquired from the unfolding unit 45 and reconstruction processing unit 44. The HFI process includes a filtering process applied to the k-space, phase correction process applied to image data, and weighted addition process applied to k-space data. Also, the HFI processing unit 43 has a capability to perform an FFT process or FT (Fourier Transform) process on the image data acquired from the unfolding unit 45 and reconstruction processing unit 44 and thereby convert the image data into k-space data.

The reconstruction processing unit 44 has a capability to perform an IFFT process or IFT (Inverse Fourier Transform) process on the k-space data acquired from the HFI processing unit 43 and thereby reconstruct the image data which is real space data.

The unfolding unit 45 has a capability to perform an unfolding process on folded intermediate image data acquired from the reconstruction processing unit 44 and thereby generate unfolded image data. The unfolding unit 45 stores sensitivity distribution data of each coil element 24c needed for the unfolding process.

The image processing unit 46 has a capability to perform necessary image processing including a distortion correction process on the image data which has been subjected to an unfolding process and HFI process and acquired from the HFI processing unit 43 and display the resulting image data on the display device 34.

(Operation)

Next, operation of the magnetic resonance imaging apparatus 20 will be described.

Figure 9:
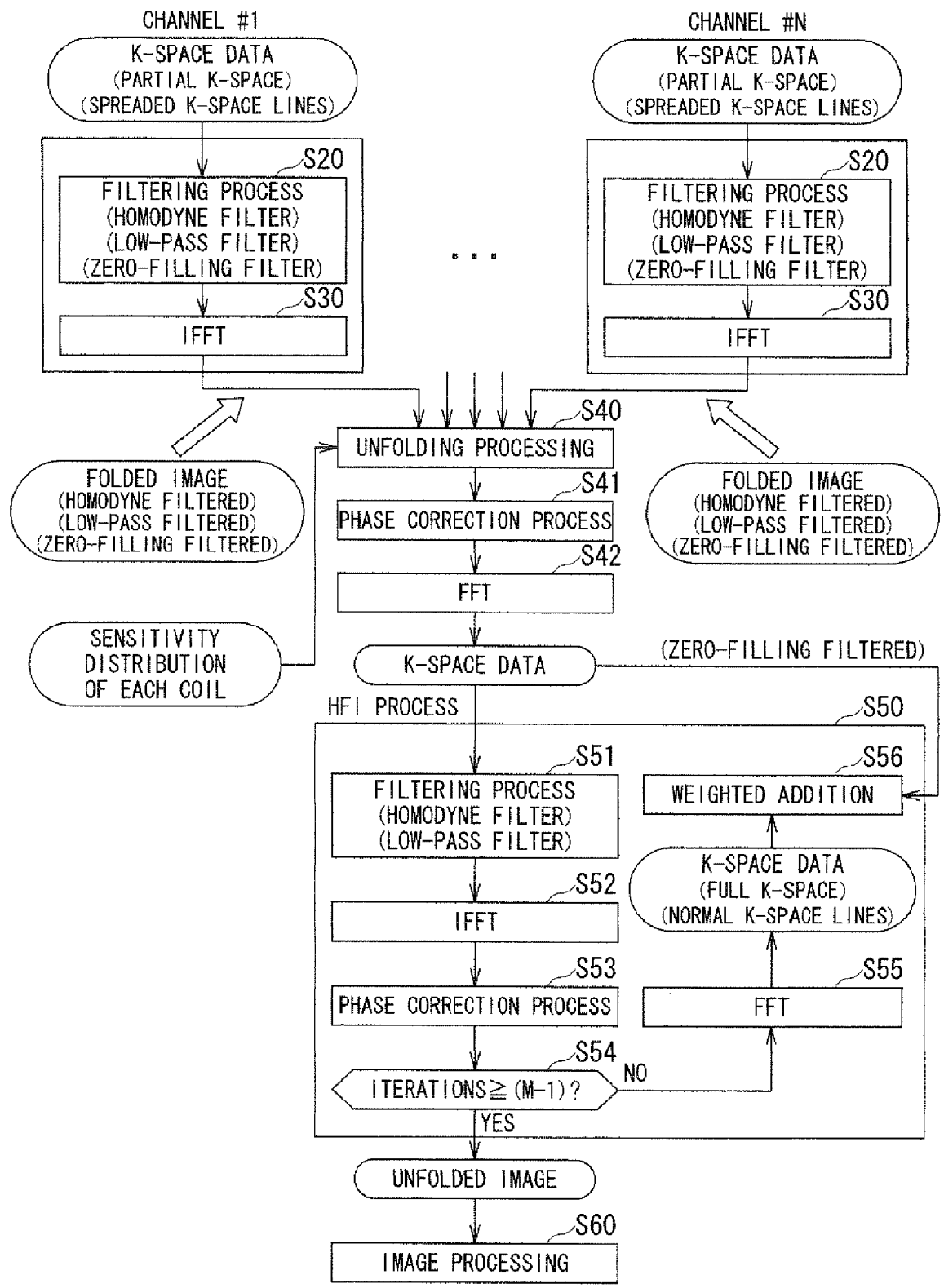
FIG. 9 is a flowchart showing procedures for acquiring image data of the patient using PI and HFI in conjunction on the magnetic resonance imaging apparatus.

FIG. 9 is a flowchart showing procedures for acquiring image data of the patient P using PI and HFI in conjunction on the magnetic resonance imaging apparatus 20 shown in FIG. 2.

Imaging conditions for PI and HFI are set by the imaging condition setting unit 40, data is collected based on the set imaging conditions, and k-space data is generated.

That is, the patient P is placed on the bed 37 in advance and a static magnetic field is formed in an imaging area of the static magnetic field magnet 21 (superconducting magnet) excited by the static magnetic field power supply 26. Also, an electric current is supplied to the shim coil 22 from the shim coil power supply 28, and consequently the static magnetic field formed in the imaging area is made uniform.

Then, as a scan start command is given to the sequence controller control unit 41 from the input device 33, the sequence controller control unit 41 supplies imaging conditions including a pulse sequence acquired from the imaging condition setting unit 40 to the sequence controller 31. Based on the pulse sequence received from the sequence controller control unit 41, the sequence controller 31 drives the gradient power supply 27, transmitter 29, and receiver 30, causing a gradient magnetic field to be formed in the imaging area in which the patient P is placed, and an RP signal to be generated from the RF coil 24.

In response to the RF signal, an NMR signal is generated by nuclear magnetic resonance in the patient P. The NMR signal is received by the RF coil 24 and supplied to the receiver 30. Upon receiving the NMR signal from the RP coil 24, the receiver 30 performs required signal processing, and then generates raw data by converting the NMR signal into digital data. The receiver 30 supplies the generated raw data to the sequence controller 31. The sequence controller 31 supplies the raw data to the sequence controller control unit 41, which then places the raw data as k-space data in the k-space formed in the k-space database 42.

The NMR signal is received by multiple coil elements 24c. Therefore, k-space data is obtained for each channel corresponding to each coil element 24c, i.e., for each of channels #1 to #N.

The k-space data is obtained under imaging conditions of parallel imaging. Therefore, line intervals of k-space data in a phase encoding direction is wider than regular line intervals used by methods other than the PI method. Furthermore, the k-space data, which is obtained also under imaging conditions of HFI, makes up partial k-space in which either a positive or negative high-frequency k-space region in the phase encoding direction is absent.

First, in Step S20, a filtering process is performed once on the k-space data on a channel-by-channel basis as part of the HFI process. That is, the HFI processing unit 43 acquires channel-by-channel k-space data from the k-space database 42 and performs the filtering process on a channel-by-channel basis.

Specifically, as shown by expressions (7-1), (7-2), and (7-3), the HFI processing unit 43 performs a filtering process fh using a Homodyne filter, filtering process fl using a low-pass filter, and filtering process fz using a zero-filling filter on k-space data K(i) for each channel i (i=1, 2, 3, . . . , Nch) corresponding to each coil element 24c and generates k-space data Kh(i) filtered through the Homodyne filter, and k-space data Kl(i) filtered through the low-pass filter, and k-space data Kz(i) filtered through the zero-filling filter.

$$K(i)*fh \rightarrow Kh(i) \quad \text{(7-1) (Step S20)}$$

$$K(i)*fl \rightarrow Kl(i) \quad \text{(7-2) (Step S20)}$$

$$K(i)*fz \rightarrow Kz(i) \quad \text{(7-3) (Step S20)}$$

Figure 10A:
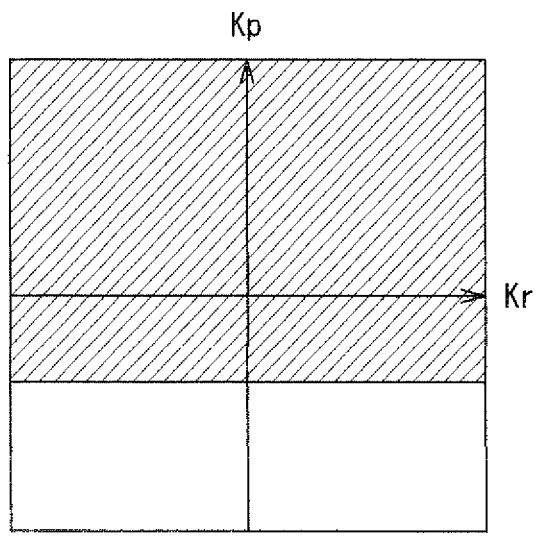
FIGS. 10A and 10B are diagrams showing k-space data after filtering through a Homodyne filter.
Figure 10B:
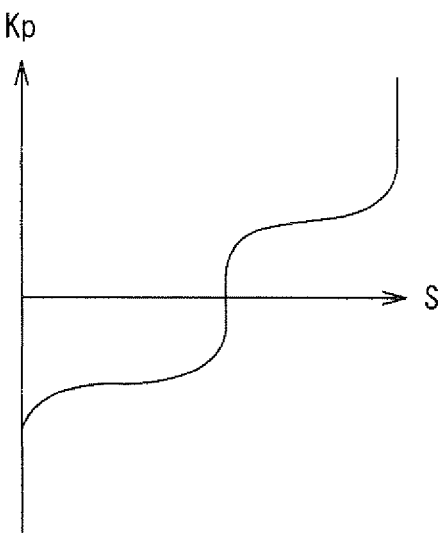
Figure 11:
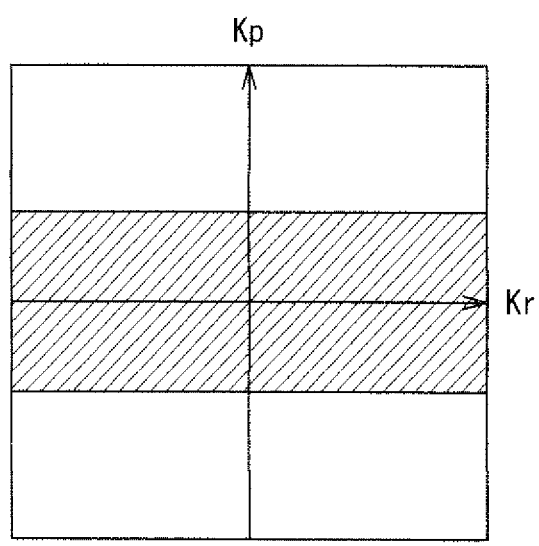
FIG. 11 is a diagram showing k-space data after filtering through a low-pass filter.

FIGS. 10A and 10B are diagrams showing the k-space data Kh(i) after filtering through the Homodyne filter and FIG. 11 is a diagram showing the k-space data Kl(i) after filtering through the low-pass filter.

In FIGS. 10A and 11, the ordinate represents the phase encoding direction Hp of the k-space while the abscissa represents a readout direction Kr of the k-space.

When the Homodyne filter fh is applied to the k-space data K(i), k-space data Kh(i) is obtained where zero values are filled in either a negative or positive high frequency region (e.g., in a negative high frequency region, as shown in FIG. 10A) where k-space data do not exist, and a boundary between a region containing data and a region filled with zero values is shaped so as to be smoothed as shown in FIG. 10B.

On the other hand, when the low-pass filter fl is applied to the k-space data K(i), k-space data Kl(i) is extracted from a low-frequency region as shown in FIG. 11.

The zero-filling filter fz is intended to simply fill, for example, the negative high-frequency region lacking k-space data with zero values, as shown in FIG. 10A, and is not intended to smooth a boundary.

Next, in Step S30, as shown by expressions (8-1), (8-2), and (8-3), the reconstruction processing unit 44 applies an IFFT process on the k-space data Kh(i), Kl(i), and Kz(i) resulting from the filtering processes performed for each channel i. Consequently, folded intermediate image data Vh(i), Vl(i), and Vz(i) are obtained as real space data.

$$IFFT(Kh(i)) \rightarrow Vh(i) \quad \quad (8\text{-}1)\ (\text{Step S30})$$

$$IFFT(Kl(i)) \rightarrow Vl(i) \quad \quad (8\text{-}2)\ (\text{Step S30})$$

$$IFFT(Kz(i)) \rightarrow Vz(i) \quad \quad (8\text{-}3)\ (\text{Step S30})$$

Next, in Step S40, the unfolding unit 45 performs an unfolding process on the intermediate image data Vh(i), Vl(i), and Vz(i) obtained by the filtering processes performed for each channel i. Specifically, as shown by expressions (9-1), (9-2), and (9-3), unfolded MR pixel values xh, xl, and xz at position Npt are found as respective vectors from imaging signal strengths yh, yl, and yz given by respective vectors whose components are Nch items of intermediate image data Vh(i), Vl(i), and Vz(i), respectively, as well as from an Nch× Npt sensitivity matrix S which represents sensitivity at the position Npt of each coil element $$xh = (S_H S)^{-1} S_H yh \quad \quad (9\text{-}1)\ (\text{Step S40})$$

$$xl = (S_H S)^{-1} S_H yl \quad \quad (9\text{-}2)\ (\text{Step S40})$$

$$xz = (S_H S)^{-1} S_H yz \quad \quad (9\text{-}2)\ (\text{Step S40})$$

where
yh={Vh(1), Vh(2), ..., Vh(Nch)}
yl={Vl(1), Vl(2), ..., Vl(Nch)}
yz={Vz(1), Vz(2), ..., Vz(Nch)}
xh={Vh_unfold(1), Vh_unfold(2), ..., Vh_unfold(Npt)}
xl={Vl_unfold(1), Vl_unfold(2), ..., Vl_unfold(Npt)}
xz={Vz_unfold(1), Vz_unfold(2), ..., Vz_unfold(Npt)}
$S_H$ is a transposed complex conjugate matrix of the matrix S.

That is, after a filtering process of the HFI process is performed only once, folded intermediate image data is reconstructed and then an unfolding process is performed on the intermediate image data for each channel i.

The unfolding unit 45 positions pixel values which are components of unfolded MR pixel value vectors xh, xl and xz at individual locations and thereby generates unfolded image data Vh_unfold, Vl_unfold, and Vz_unfold.

Next, in Step S41, the HFI processing unit 43 performs a phase correction process on the unfolded image data Vh_unfold, Vl_unfold using expression (10). Consequently, unfolded image data V_unfold which has undergone phase correction and data filling is obtained.

$$V\_\text{unfold} = 2\cdot\text{Real part}\{Vh\_\text{unfold}*Vl\_\text{unfold}/|Vl\_\text{unfold}|\} \quad (10)$$

However, the k-space data used to generate the image data at this stage does not necessarily have high data accuracy in respect to the filled region.

Therefore, in Step S42, using expressions (11-1) and (11-2), the HFI processing unit 43 computes Fourier transforms (FFT) of the unfolded image data V_unfold and the unfolded image data Vz_unfold which has been filtered through the zero-filling filter fz earlier, and thereby returns the unfolded image data to k-space data.

$$K\_\text{unfold} = FFT(V\_\text{unfold}) \quad \quad (11\text{-}1)$$

$$K\_\text{unfold} = FFT(Vz\_\text{unfold}) \quad \quad (11\text{-}2)$$

Then, in Step S50, the HFI process (Steps S51 to S56) given by expressions (12-1) to (12-6) is repeated a predetermined number of times, for example, 1 to 4 times.

$$K\_\text{unfold}*fh \rightarrow Kh\_\text{unfold} \quad \quad (12\text{-}1)\ (\text{Step S51})$$

$$K\_\text{unfold}*fl \rightarrow Kl\_\text{unfold} \quad \quad (12\text{-}2)\ (\text{Step S51})$$

$$IFFT(Kh\_\text{unfold}) \rightarrow Vh\_\text{unfold} \quad \quad (12\text{-}3)\ (\text{Step S52})$$

$$IFFT(Kl\_\text{unfold}) \rightarrow Vl\_\text{unfold} \quad \quad (12\text{-}4)\ (\text{Step S52})$$

$$V\_\text{unfold} = 2\cdot\text{Real part}\{Vh\_\text{unfold}*Vl\_\text{unfold}/|Vl\_\text{unfold}|\} \quad (12\text{-}5)\ (\text{Step S53})$$

$$K\_\text{unfold} = \alpha*FFT(V\_\text{unfold}) + (1-\alpha)*K\_\text{unfold}$$
$$(0 < \alpha < 1) \quad \quad (12\text{-}6)\ (\text{Steps S55, S56})$$

That is, the HFI processing unit 43 performs a filtering process on the k-space data K_unfold (Step S51) and the reconstruction processing unit 44 performs IFFT of the k-space data Kh_unfold and Kl_unfold subjected to the filtering process and thereby reconstruct temporary image data Vh_unfold and Vl_unfold (Step S52). Next, the HFI processing unit 43 performs a phase correction process on the temporary image data Vh_unfold and Vl_unfold (Step S53). Consequently, the image data V_unfold subjected to the phase correction process is obtained. Next, the HFI processing unit 43 performs weighted addition of the k-space data obtained by taking FFT of the image data V_unfold and the k-space data K_unfold (expression (11-2)) obtained from the image data Vz_unfold subjected to the zero-filling process and uses the k-space data subjected to the weighted addition as k-space data K_unfold for a next HFI process (Steps S55 and S56).

The weighting coefficient α used for the weighted addition is set to a value such as 0.5 according to required accuracy. An appropriate value of the weighting coefficient α can be established in advance, for example, based on tests or simulations. Alternatively, the user may be allowed to variably set the weighting coefficient α together with the number of iterations of HFI as data processing conditions via the input device 33.

When the HFI process is performed a predetermined number of times (Step S55), the temporary image data V_unfold subjected to phase correction and data filling becomes final image data Vfinal as shown by expression (13).

$$V\text{final} = V\_\text{unfold} \quad \quad (13)$$

As Steps S51 to S56 are repeated, the accuracy of the data which fills the high-frequency region located on one side of the k-space and lacking data at first is increased gradually, resulting in the final image data Vfinal of high quality.

Next, in Step S60, the image processing unit 46 performs necessary image processing including a distortion correction process on the final image data Vfinal which has been subjected to an unfolding process and HFI process and acquired from the HFI processing unit 43 and displays the resulting image data on the display device 34. This allows the user to make a diagnosis using the final image data displayed on the display device 34.

Figure 1:
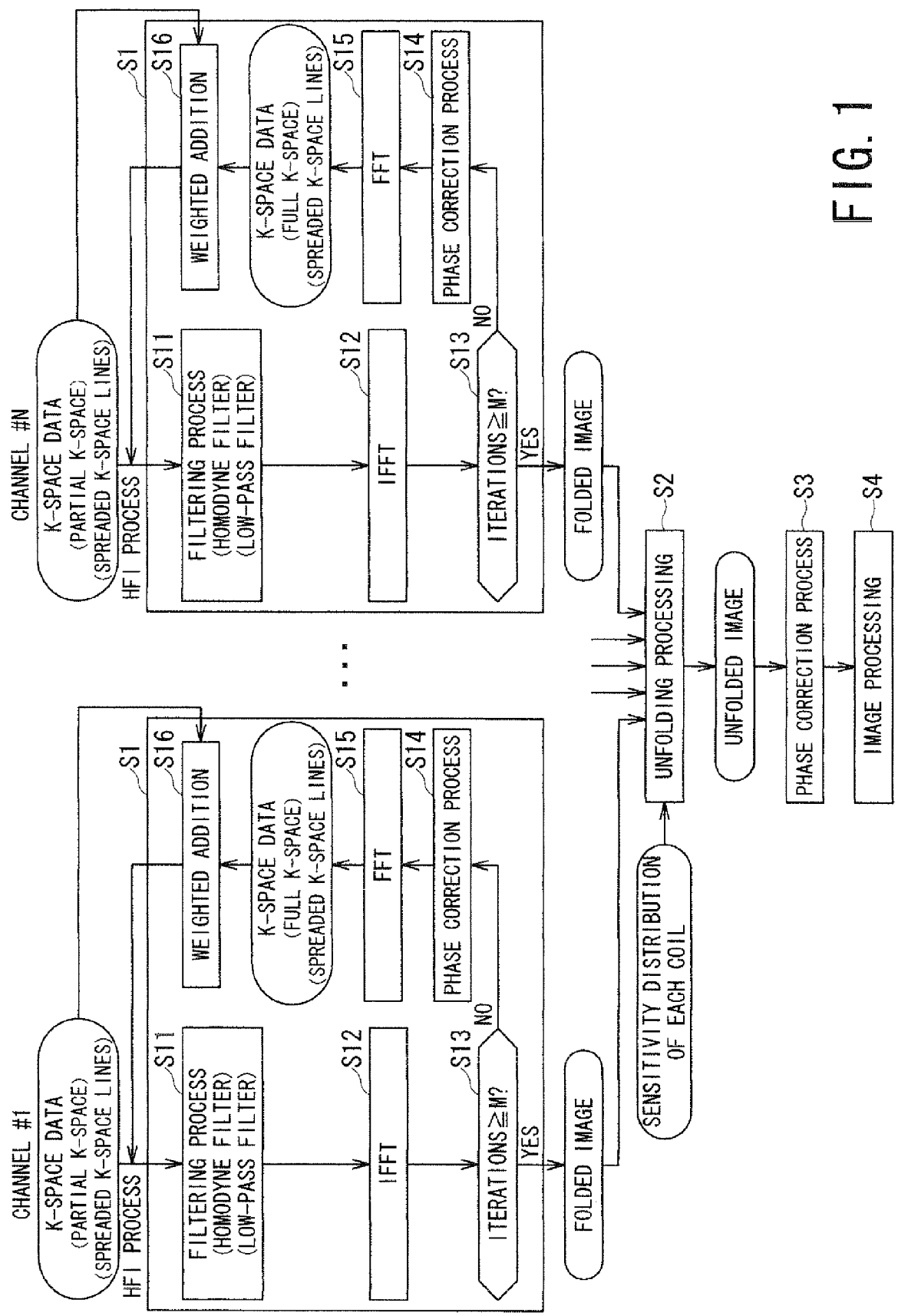
FIG. 1 is a flowchart showing conventional data processing procedures in which PI and HFI are used in conjunction.

The HFI process described in Steps S51 to S56 according to the present embodiment is in itself similar to a conventional HFI process (Steps S11 to S16 in FIG. 1). However, the conventional HFI process repeats HFI process on a channel-by-channel basis before performing an unfolding process. Therefore, if the number of channels is N and the number of iterations of HFI is M, the process of each step in the HFI process needs to be carried out N×M times.

In contrast, the magnetic resonance imaging apparatus 20 according to the present embodiment is configured to perform a PI unfolding process after the filtering process is performed once on a channel-by-channel basis as part of the HFI process, and then repeatedly perform the HFI process on the image data subjected to the unfolding process. Therefore, if the number of channels is N and the number of iterations of HFI is M as in the case of the conventional HFI process, generally the process of each step in the HFI process is carried out N+(M−1) times.

In this way, the imaging performed by the magnetic resonance imaging apparatus 20 according to the present embodiment using PI and HFI in conjunction can greatly reduce amounts of data processing and data processing time compared to conventional imaging which uses PT and HFI in conjunction. On the other hand, if the amounts of data processing and data processing time are set equal to those of the conventional imaging which uses PI and HFI in conjunction, the imaging performed by the magnetic resonance imaging apparatus 20 according to the present embodiment using PI and HFI in conjunction can increase the number of iterations of the HFI process, improving the accuracy of data filling.

(Variation)

Although in the example described above, a phase correction process and data filling process are performed on image data, the phase correction process and data filling process may be performed on k-space data. If the phase correction process and data filling process are performed on k-space data, the processes are simplified. On the other hand, if the phase correction process and data filling process are performed on image data, accuracy can be improved.

When the phase correction process and data filling process are performed on k-space data, data processing is performed as follows. Specifically, k-space data k0part(i) in which data is filled in regions other than either positive or negative high-frequency region is collected for each channel i corresponding to each coil element 24c. Next, that region of the k-space in which data has not been collected is filled with k-space data by the conventional half Fourier method which uses complex symmetry of data in the k-space. Consequently, k-space data k0(i) of the entire k-space is obtained.

Next, a phase correction process is performed on the k-space data k0(i). Then, IFFT is performed on the k-space data k0(i)_cor subjected to phase correction, and consequently, folded intermediate image data V0(i) is reconstructed. Subsequently, the intermediate image data V0(i) is unfolded to create unfolded intermediate image data V0_unfold.

Next, the accuracy of data filling is improved by repeating an HFI process including a data filling process, phase correction process, and weighted addition process using k-space data k0part_unfold as initial data which is obtained by performing FFT on the unfolded image data, V0_unfold. The weighted addition process is performed by adding the k-space data after the data filling process and the phase correction process with weighting coefficient α and the k-space data before data filling with weighting coefficient (1−α).

(Other Embodiments)

The embodiment described above is a technique for reducing the amounts of data processing and data processing time in imaging implemented by a combination of the PI and HFI methods which use multiple coils.

There are techniques which improve the SNR by combining outputs of multiple coils while keeping the line intervals within a range which does not cause folding as in the case of regular imaging instead of increasing the line intervals in the phase encoding direction as in the case of the PI method. Most of these techniques are called an SOS method because they combine coil outputs by taking a Sum Of Squares of the coil outputs (or subsequently calculate the square root of the sum).

The above-described technique for reducing the amounts of data processing and data processing time is also applicable to imaging implemented by a combination of the SOS and HFI methods.

Figure 12:
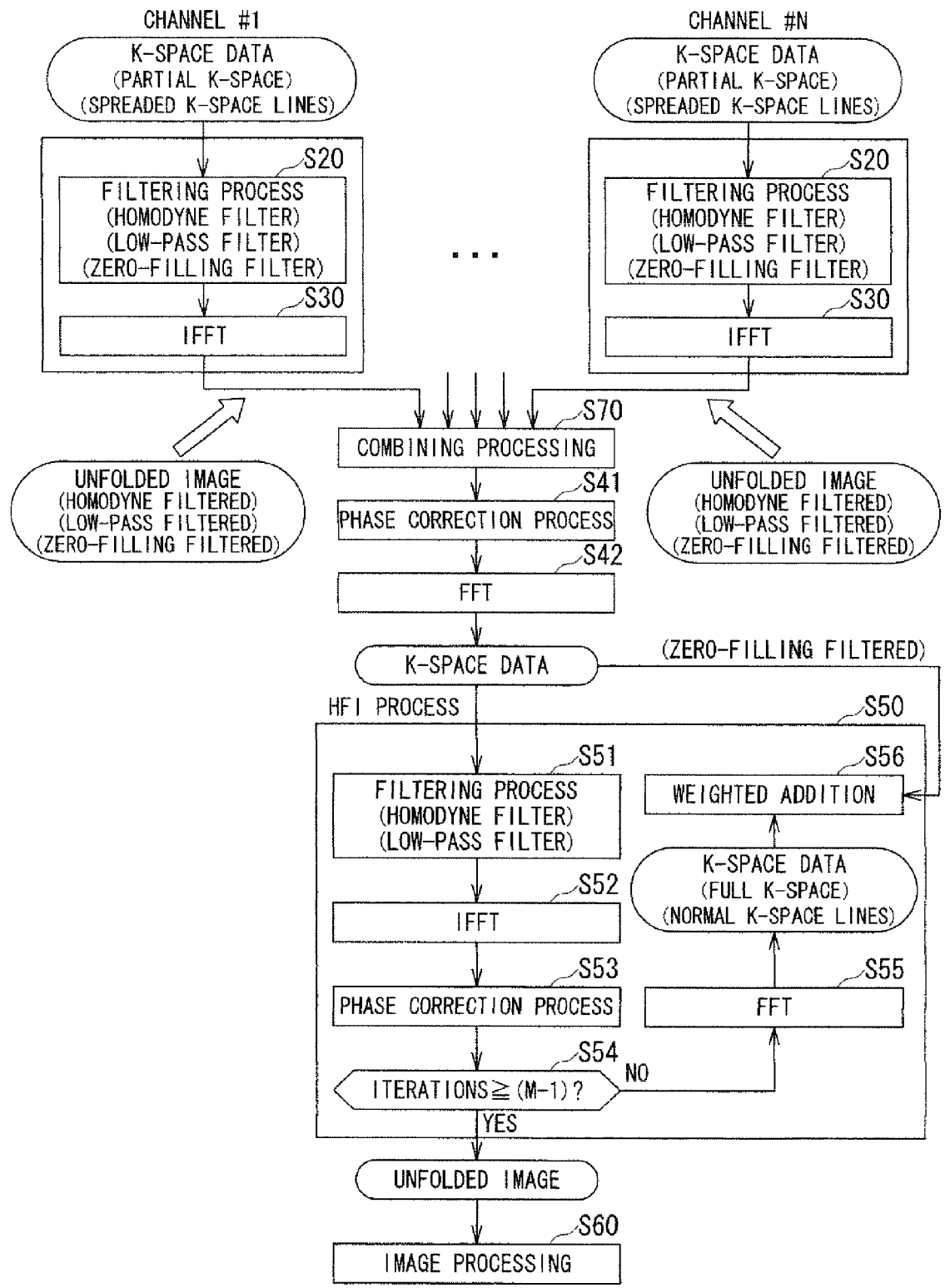
FIG. 12 is a flowchart showing procedures for acquiring image data of the patient using SOS and HFI in conjunction on the magnetic resonance imaging apparatus.

FIG. 12 is a flowchart of a process capable of reducing the amounts of data processing and data processing time in imaging which uses the SOS and HFI methods in conjunction. Basic processes are the same as those shown in FIG. 9 described above, and a difference lies in that the unfolding process (Step S40) is replaced by a combining process using the SOS method (Step S70). With the present embodiment again, the HFI process is performed repeatedly on a single set of image data produced by combining the outputs from individual channels. This reduces the amounts of data processing and data processing time compared to when the HFI process is performed repeatedly on each channel output.

While certain embodiments have been described, these embodiments have been presented by way of example only, and are not intended to limit the scope of the invention. Indeed, the novel apparatuses and units described herein may be embodied in a variety of other forms; furthermore, various omissions, substitutions and changes in the form of the apparatuses and units described herein may be made without departing from the spirit of the invention. The accompanying claims and their equivalents are intended to cover such forms or modifications as would fall within the scope and spirit of the invention.

What is claimed is:

1. A magnetic resonance imaging apparatus, comprising:
   a data collection unit configured to collect magnetic resonance data from a patient by a half Fourier method using a plurality of coils;
   a first data processing unit configured to fill data in an unsampled region of the magnetic resonance data obtained from the plurality of coils by using homodyne filtering while performing reconstruction processing using a Fourier transformation, and to generate a plurality of folded image data corresponding to each of the plurality of coils;
   an unfolding unit configured to perform an unfolding process on the plurality of folded image data by using sensitivity data of the plurality of coils; and
   a second data processing unit configured to repeat, after the unfolding processing, an improving process plural times for improving accuracy of the data filled by the first data processing unit, and to generate image data for display, the improving process including at least further homodyne filtering.

2. The magnetic resonance imaging apparatus according to claim 1, wherein the half Fourier method used by the data collection unit sets one of a positive high-frequency region and a negative high-frequency region of the k-space in a phase encoding direction as the unsampled region.

3. The magnetic resonance imaging apparatus according to claim 1, wherein the second data processing unit is configured to repeat the improving process while performing a data filling process and a phase correction process on image data obtained by inverse Fourier-transforming k-space data in a region other than one of a positive high-frequency region and a negative high-frequency region.

4. The magnetic resonance imaging apparatus according to claim 1, wherein the data processing unit is configured to repeat the improving process while performing a data filling process and a phase correction process on k-space data in a region other than one of a positive high-frequency region and a negative high-frequency region.

5. The magnetic resonance imaging apparatus according to claim 1, wherein:
the unfolding unit further generates unfolded, zero-filled image data from k-space data produced by filling the unsampled region with zeros; and
the second data processing unit a) generates intermediate k-space data and zero-filled k-space data, respectively, by Fourier-transforming the unfolded image data and the unfolded, zero-filled image data generated by the unfolding unit, b) by designating the intermediate k-space data as first intermediate k-space data, applies the further homodyne filtering to the first intermediate k-space data to pass the first intermediate k-space data through a region other than the unsampled region, and then generates temporary image data by inverse Fourier-transforming the first intermediate k-space data, c) performs the phase correction process on the temporary image data using a phase obtained from a low-frequency region of the first intermediate k-space data, d) generates second intermediate k-space data by Fourier-transforming the temporary image data subjected to the phase correction process, e) performs weighted addition of the second intermediate k-space data and the zero-filled image data and designates resulting data as the first intermediate k-space data, and f) improves the accuracy of the data used to fill the unsampled region by repeating b) to e).

6. A magnetic resonance imaging apparatus, comprising:
a data collection unit configured to collect magnetic resonance data from a patient by a half Fourier method using a plurality of coils;
a first date processing unit configured to fill data in an unsampled region of the magnetic resonance data obtained from the plurality of coils by using homodyne filtering while performing reconstruction processing using a Fourier transformation, and to generate a plurality of image data corresponding to each of the plurality of coils;
a combining unit configured to synthesize image data by combining the plurality of image data corresponding to the plurality of coils using sum of squares calculations which involve adding the squares of each pixel in a plurality of items of image data obtained from the plurality of coils; and
a second data processing unit configured to repeat, after combining the plurality of image data, an improving process plural times for improving accuracy of the data filled by the first data processing unit, and to generate image data for display, the improving process including at least further homodyne filtering.

* * * * *